United States Patent
Bedeschi et al.

(10) Patent No.: US 8,467,226 B2
(45) Date of Patent: Jun. 18, 2013

(54) PROGRAMMING AN ARRAY OF RESISTANCE RANDOM ACCESS MEMORY CELLS USING UNIPOLAR PULSES

(75) Inventors: Ferdinando Bedeschi, Biassono (IT); Innocenzo Tortorelli, Moncalieri (IT)

(73) Assignee: Micron Technology, Inc., Boise, ID (US)

( * ) Notice: Subject to any disclaimer, the term of this patent is extended or adjusted under 35 U.S.C. 154(b) by 211 days.

(21) Appl. No.: 13/007,544

(22) Filed: Jan. 14, 2011

(65) Prior Publication Data

US 2012/0182783 A1    Jul. 19, 2012

(51) Int. Cl.
*G11C 11/00* (2006.01)
*G11C 11/56* (2006.01)

(52) U.S. Cl.
CPC .................................... *G11C 11/56* (2013.01)
USPC ...... 365/148; 365/163; 365/174; 365/189.11; 365/189.02

(58) Field of Classification Search
CPC ... G11C 11/56; G11C 11/5678; G11C 13/0004
USPC .............. 365/148, 163, 174, 189.011, 189.02
See application file for complete search history.

(56) References Cited

U.S. PATENT DOCUMENTS

2009/0279343 A1* 11/2009 Chang et al. .................. 365/148

* cited by examiner

*Primary Examiner* — Thong Q Le
(74) *Attorney, Agent, or Firm* — Knobbe, Martens, Olson & Bear LLP

(57) ABSTRACT

Subject matter disclosed herein relates to a memory device, and more particularly to programming a non-volatile memory device.

20 Claims, 5 Drawing Sheets

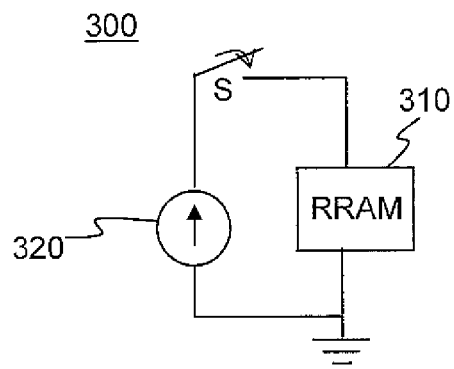
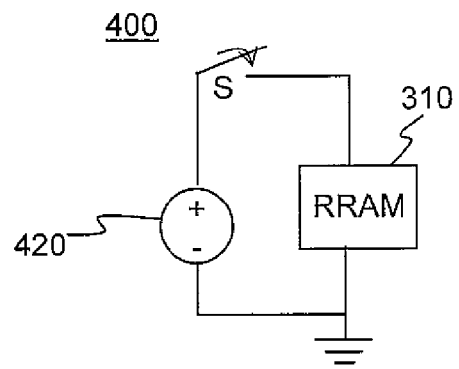
FIG. 3                    FIG. 4
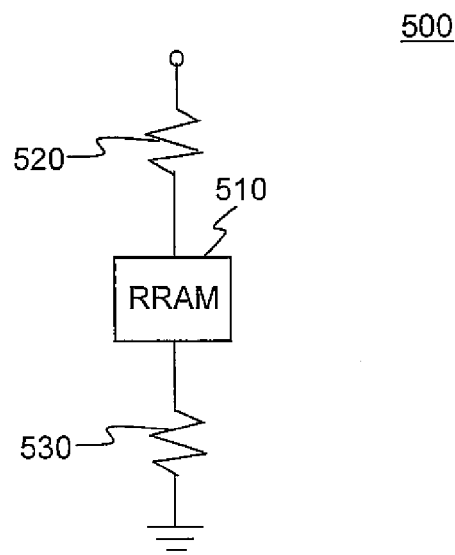
FIG. 5

PROGRAMMING AN ARRAY OF RESISTANCE RANDOM ACCESS MEMORY CELLS USING UNIPOLAR PULSES

BACKGROUND

1. Field

Subject matter disclosed herein relates to a memory device, and more particularly to programming a non-volatile memory device.

2. Information

A feature of non-volatile memory devices is that loss of data stored in their memory cells need not occur if an external power supply is removed. Thus, such non-volatile memory devices are widely employed in a variety of electronics, including computing systems, mobile communication systems, memory cards, and the like.

A resistance random access memory (RRAM) device comprises a type of non-volatile memory that uses a variable resistive material layer as a data storage material layer. Such a variable resistive material layer may exhibit reversible resistance variance in accordance with a polarity and/or amplitude of an applied electric pulse, for example.

BRIEF DESCRIPTION OF THE FIGURES

Non-limiting and non-exhaustive embodiments will be described with reference to the following figures, wherein like reference numerals refer to like parts throughout the various figures unless otherwise specified.

FIG. 3 is a schematic diagram of a circuit to program a memory cell, according to an embodiment.

FIG. 4 is a schematic diagram of a circuit to program a memory cell, according to another embodiment.

FIG. 5 is a circuit diagram illustrating intrinsic resistance associated with a memory cell, according to an embodiment.

DETAILED DESCRIPTION

Figure 1:
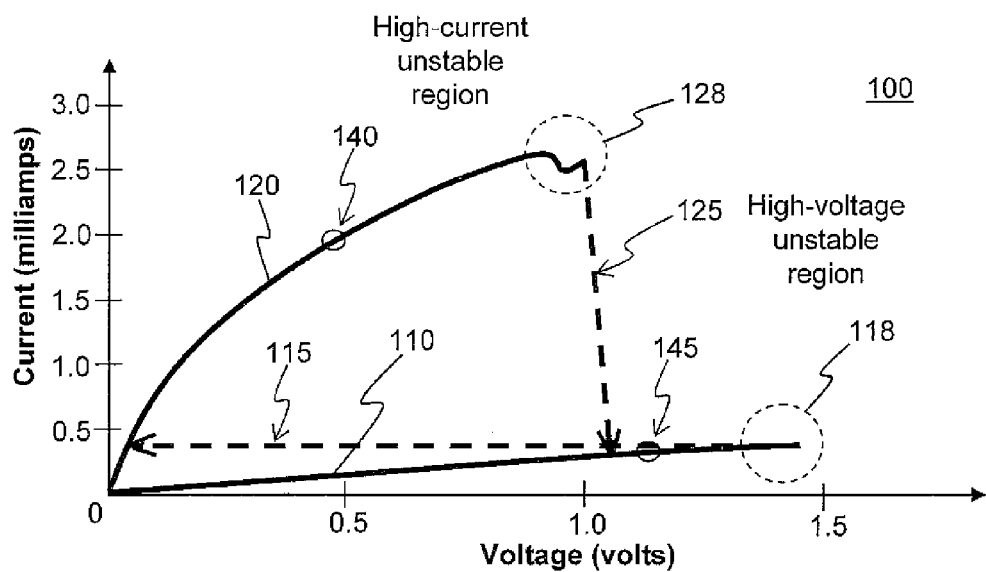
FIG. 1 is a plot of current-voltage characteristics of a memory cell, according to an embodiment.

Reference throughout this specification to "one embodiment" or "an embodiment" means that a particular feature, structure, or characteristic described in connection with the embodiment is included in at least one embodiment of claimed subject matter. Thus, the appearances of the phrase "in one embodiment" or "an embodiment" in various places throughout this specification are not necessarily all referring to the same embodiment. Furthermore, the particular features, structures, or characteristics may be combined in one or more embodiments.

Resistance random access memory (RRAM) comprises non-volatile memory that may be applied in electronic devices that would otherwise use floating gate memory, such as Flash for example. A problem that may arise with RRAM, however, relates to a set-to-reset state transition of a unipolar RRAM cell integrated into a memory array. In particular, current-voltage characteristics of a single RRAM cell may be different from those of a RRAM cell that is incorporated in an array of RRAM cells. Programming errors may occur if such different current-voltage characteristics are not accounted for while programming an array of RRAM cells. Embodiments described herein include techniques or electronic architecture to program RRAM cells in an array from a set state to a reset state.

Differences between current-voltage characteristics of a single RRAM cell and current-voltage characteristics of RRAM cells in an array, as mentioned above, may result from circuit elements that may be present in the array that are not present for the single RRAM cell. For example, an array of RRAM cells may include wordlines, bitlines, switching diodes, and so on, whereas a single RRAM cell need not include such elements. As will be explained in further detail below, wordlines, bitlines, and/or selectors (e.g., diodes, bipolar transistors, MOSFET's, and so on) may include an intrinsic resistance that may affect current-voltage characteristics of RRAM cells. In an implementation, intrinsic resistance of bitlines and/or selectors may affect RRAM cells of an array more so than intrinsic resistance of wordlines because particular programming signals are provided to the RRAM cells via bitlines and/or selectors instead of wordlines, for example.

In an embodiment, memory cells of a non-volatile memory device such as a RRAM device may be programmed to be in either a set state, representing logic "1", or a reset state, representing logic "0". A set state of a RRAM cell may comprise a low-resistance state while a reset state may comprise a high-resistance state. Details of such states will be described below. In an implementation, RRAM cells in an array may be programmed from one state to the other state (e.g., reset state to set state or vise versa) by applying an electric pulse across electrode terminals of the RRAM cells via bitlines and/or wordlines in the array. As mentioned above, programming a RRAM cell integrated into a memory array from a set state to a reset state may present complications, discussed below. (Programming such a RRAM cell from a reset state to a set state need not present complications, however.)

Accordingly, to overcome programming complications, in an embodiment, a method of programming a RRAM cell from a set state to a reset state may include initiating such a state transition by applying a first portion of an electric pulse to a bitline to deliver enough programming current for the state transition (of the order of milliamps, for example). Soon after switching to a high resistive state, the memory cell may be driven to such an unstable state, which is explained in detail below, for a relatively short time before physical damage to the memory cell or spurious transition to the previous state may occur. Thus, a second portion of the electric pulse may be applied to the memory cell during the resulting state transition to relatively quickly decrease the voltage of the electric pulse across the cell so as to return the memory cell to a stable state. Such a method of programming a RRAM cell may be performed by a memory controller, for example. Reasons why such a method of programming a RRAM cell includes momentarily driving the RRAM cell into an unstable state are explained in detail below in reference to current-voltage characteristics of the RRAM cell integrated in a relatively dense array. In one implementation, a second portion of an electric pulse used to return the RRAM cell to a stable state from a high-voltage unstable state may comprise a decaying resistor-capacitor (RC) voltage.

FIG. 1 is a plot of current-voltage characteristics 100 of a RRAM cell, according to an embodiment. For example, such a RRAM cell may comprise a nickel-oxide (NiO) active material. Such a RRAM cell may exist in a set state on set-state curve 120 or a reset state on reset-state curve 110, for example. If the RRAM cell is in the set state then current and voltage of the RRAM cell (e.g., current through the RRAM cell and voltage across the RRAM cell) may be described by set-state curve 120. For example, the RRAM cell may be in a set state at point 140 on the set-state curve 120. In this case, the RRAM cell may conduct a current of about 2.0 milliamps with a voltage of about 0.5 volts. A set-state of a RRAM cell is considered to be a low-resistance state. On the other hand, if the RRAM cell is in the reset state then current and voltage of the RRAM cell may be described by reset-state curve 110. For example, the RRAM cell may be in a reset state at point 145 on the reset-state curve 110. In this case, the RRAM cell may conduct a current of about 0.3 milliamps with a voltage of about 1.25 volts. A reset-state of a RRAM cell is considered to be a high-resistance state.

Transitions from one state to another may be performed by applying an electric pulse across electrodes of the RRAM cell. Depending on the desired transition, such an electric pulse may comprise a voltage pulse or a current pulse. For example, a voltage pulse applied to the RRAM cell may initiate a transition from the set state to the reset state via transition line 125, whereas a current pulse may initiate a transition from the reset state to the set state via transition line 115. To illustrate by example, if the RRAM cell is in a set state at point 140, then applying a voltage pulse to the RRAM cell may drive the RRAM cell from point 140 to set terminus 128. As the voltage of the voltage pulse continues to increase beyond set terminus 128, the RRAM cell may transition via transition line 125 to a reset state on reset-state curve 110. Depending, at least in part, on the magnitude of the voltage pulse, the RRAM cell may then be in a reset state at point 145, for example.

In another example, if the RRAM cell is in a reset state at point 145, then applying a current pulse to the RRAM cell may drive the RRAM cell from point 145 to reset terminus 118. As the current of the current pulse continues to increase beyond reset terminus 118, the RRAM cell may transition via transition line 115 to a set state on set-state curve 120. Depending, at least in part, on the magnitude of the current pulse, the RRAM cell may then be in a set state at point 140, for example. Of course, such details of current-voltage characteristics of a RRAM cell are merely examples, and claimed subject matter is not so limited.

FIG. 3 is a schematic diagram of a circuit 300 to program a RRAM cell, according to an embodiment. In particular, circuit 300 may generate a current pulse to program RRAM cell 310 from a reset state to a set state using a current source 320. A memory controller, for example, may initiate such a transition by closing switch S to connect current source 320 to RRAM cell 310.

FIG. 4 is a schematic diagram of a circuit 400 to program a RRAM cell, according to an embodiment. In particular, circuit 400 may generate a voltage pulse to program RRAM cell 310 from a set state to a reset state using a voltage source 420. A memory controller, for example, may initiate such a transition by closing switch S to connect voltage source 420 to RRAM cell 310.

As discussed above, the RRAM cell described in FIG. 3 may exist in a set state on set-state curve 120 or a reset state on reset-state curve 110, for example. Such states may be considered stable states. On the other hand, if the RRAM cell is driven to a voltage and/or current that is beyond a range of both the set-state curve 120 and the reset-state curve 110, then the RRAM cell may be considered to be in an unstable state. For example, the RRAM cell being driven to a voltage greater than that of reset terminus 118 (e.g., a voltage greater than about 1.5 volts) may be considered to be in a high-voltage unstable state, as shown in a right portion of FIG. 1. For another example, the RRAM cell being driven to a current greater than that of set terminus 128 (e.g., a current greater than about 2.5 milliamps) may be considered to be in a high-current unstable state, as shown in a top portion of FIG. 1. A RRAM cell existing in such unstable states may not reliably maintain stored information. In addition, a RRAM cell existing in such unstable states for a period of time may succumb to physical damage.

As explained above, differences between current-voltage characteristics of a single RRAM cell and current-voltage characteristics of RRAM cells in an array may result from circuit elements that may be present in the array that are not present for the single RRAM cell. For example, an array of RRAM cells may include bitlines, wordlines, selectors, and so on, whereas a single RRAM cell need not include such elements. Bitlines, wordlines, and/or selectors may include an intrinsic resistance that may affect current-voltage characteristics of RRAM cells in the array, particularly in the set state, wherein relatively large program currents may be involved.

FIG. 5 is a schematic diagram of a circuit 500 illustrating inherent resistance associated with a RRAM cell incorporated in an array, according to an embodiment. Intrinsic bitline resistance 520 and intrinsic diode resistance 530 may be in series with RRAM cell 510. For example, such intrinsic resistances may be in the order of kilo-ohms for a 45.0 nm technology node with copper metallization, though claimed subject matter is not so limited.

Figure 2:
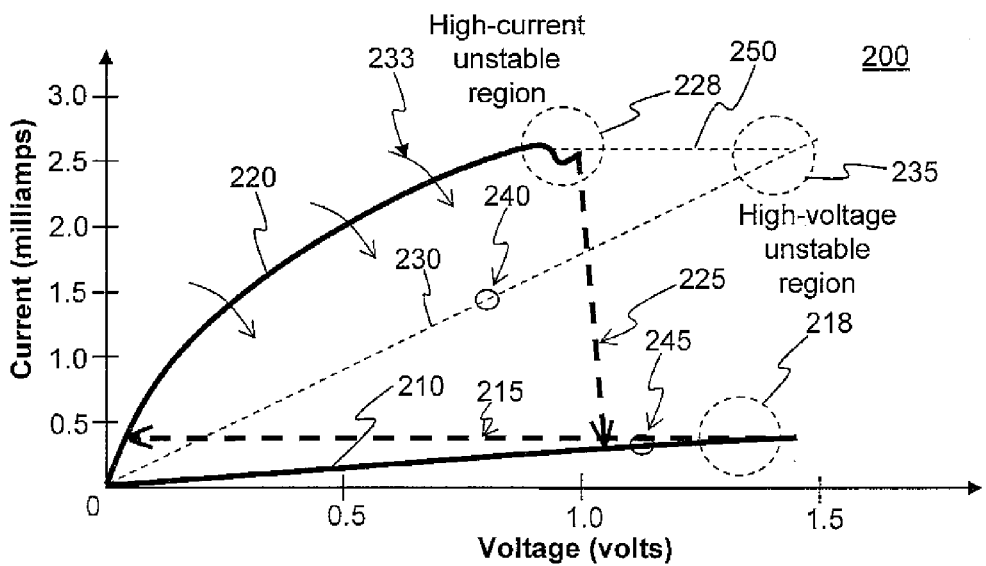
FIG. 2 is a plot of current-voltage characteristics of a memory cell, according to another embodiment.

FIG. 2 is a plot of current-voltage characteristics 200 of a RRAM cell that may be incorporated in an array of RRAM cells, according to an embodiment. For example, such a RRAM cell may be similar the RRAM cell having current-voltage characteristics 100 in FIG. 1, except for differences that may arise as a result of the RRAM cell being incorporated in an array. Accordingly, set-state curve 220 may be modified as indicated by arrows 233. A modified set-state curve 230 may result. In addition, modified set-state curve 230 may include a modified set terminus 235, which may be located in a high-voltage unstable portion of current-voltage characteristics 200 for the RRAM cell. Such a situation will be described further below. Other features of current-voltage characteristics 200 may be similar to that shown in FIG. 1. For example, a RRAM cell may exist in a set state on set-state curve 230 or a reset state on reset-state curve 210. If the RRAM cell is in the set state then current and voltage of the RRAM cell may be described by set-state curve 230. For example, the RRAM cell may be in a set state at point 240 on the set-state curve 230. In this case, the RRAM cell may conduct a current of about 1.5 milliamps with a voltage of about 0.8 volts. Such current may be relatively less than the case shown in FIG. 1 because intrinsic resistances of a memory cell array are taken into account with modified set-state curve 230 in FIG. 2. If the RRAM cell is in the reset state then current and voltage of the RRAM cell may be described by reset-state curve 210. For example, the RRAM cell may be in a reset state at point 245 on the reset-state curve 210. In this case, the RRAM cell may conduct a current of about 0.3 milliamps with a voltage of about 1.25 volts.

As in the case shown in FIG. 1, transitions from one state to another may be performed by applying an electric pulse across electrodes of the RRAM cell. Depending on the desired transition, such an electric pulse may comprise a voltage pulse or a current pulse. For example, a voltage pulse applied to the RRAM cell may initiate a transition from the set state to the reset state via transition line 225, whereas a current pulse may initiate a transition from the reset state to the set state via transition line 215. In the case for a transition from the set state to the reset state, however, modified set-state curve 230 may present features not present if the set-state curve 220 were not modified (e.g., as in the case for FIG. 1). To illustrate by example, if the RRAM cell is in a set state at point 240, then applying a voltage pulse to the RRAM cell may drive the RRAM cell from point 240 to modified set terminus 235. As mentioned above, modified set terminus 235 may be located in an unstable region of the RRAM cell. Thus, to continue a transition from the set state to the reset state, and to prevent physical damage to the RRAM cell, the magnitude of the applied voltage pulse may be decreased so that the RRAM cell is driven from modified set terminus 235 to set terminus 228, where the RRAM cell may transition via transition line 225 to a reset state on reset-state curve 210. Depending, at least in part, on the magnitude of the voltage pulse, the RRAM cell may then be in a reset state at point 245, for example. Thus, in summary, a transition from the set state to the reset state may occur via a transition path through an unstable state of a RRAM cell.

If the RRAM cell is in a reset state at point 245, then applying a current pulse to the RRAM cell may drive the RRAM cell from point 245 to reset terminus 218. As the current of the current pulse continues to increase beyond reset terminus 218, the RRAM cell may transition via transition line 215 to a set state on set-state curve 220. Depending, at least in part, on the magnitude of the current pulse, the RRAM cell may then be in a set state at point 240, for example. Thus, a process of performing a transition from a reset state to a set state of a RRAM cell in an array, as just described, may not be substantially different from that of an isolated RRAM cell. On the other hand, a process of performing a transition from a set state to a reset state of a RRAM cell in an array may be substantially different from that of an isolated RRAM cell. Accordingly, details of techniques for performing such a transition from a set state to a reset state are described below. Of course, such details of current-voltage characteristics of a RRAM cell incorporated in an array are merely examples, and claimed subject matter is not so limited.

Figure 6:
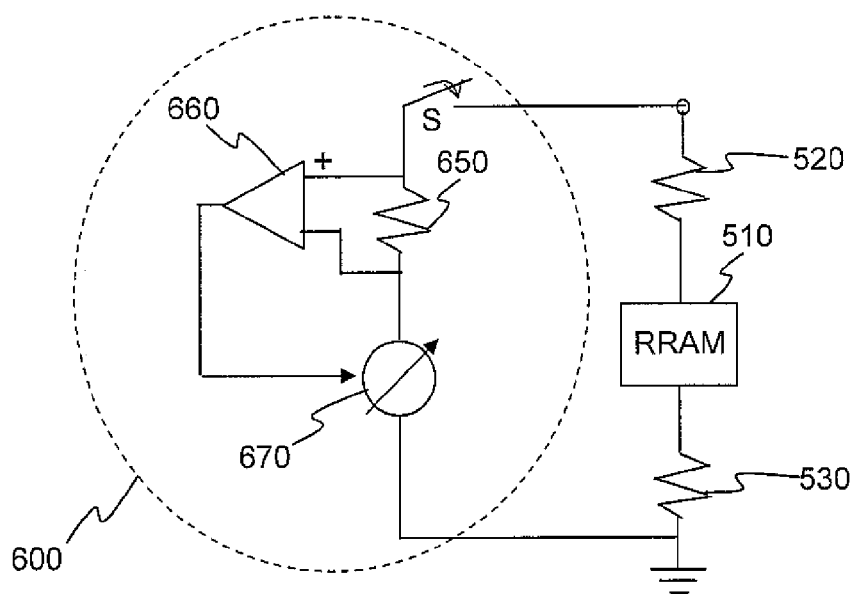
FIG. 6 is a schematic diagram of a circuit to program a memory cell including intrinsic resistance, according to an embodiment.

FIG. 6 is a schematic diagram of a drive circuit 600 to program a RRAM cell including intrinsic resistance of array elements, according to an embodiment. For example, RRAM cell 510 may be connected in series with intrinsic bitline (and/or wordline) resistance 520 and intrinsic diode resistance 530, also shown in FIG. 5. As described above, programming RRAM cell 510 to transition from a set state to a reset state may include at least momentarily driving RRAM cell 510 into a high-voltage unstable state after the state transition. Such may be the case, for example, due to a parasitic voltage drop on a programming path that may be localized across the cell soon after the state transition. In detail, such a transition from a set state to a reset state may be performed by applying a first portion of an electric pulse to deliver required programming current to the RRAM cell 510 to overcome parasitic paths, and then applying a second portion of the electric pulse to decrease the voltage of the electric pulse to lead the RRAM cell to a stable state. Thus, drive circuit 600 may generate such an electric pulse that is applied to RRAM cell 510 if switch S is closed. Characteristics (e.g., the shape) of such an electric pulse may be tailored to particular features of RRAM cell 510. For example, a first portion of an electric pulse to deliver required programming current may have a particular time span, magnitude, and so on. As another example, a second portion of the electric pulse to drive RRAM cell 510 into a stable state may have a particular time span, magnitude, decay rate, and so on. Accordingly, a variable current source 670, in conjunction with operational amplifier 660 and shunt resistor 650 may be selected to generate an electric pulse having first and second portions that are favorable to perform a state transition of RRAM cell 510 without damaging RRAM cell 510. In one implementation, drive circuit 600 may perform a real-time verify process using a closed loop feedback to a program generator (not shown). A programming pulse may stop in response to a drop of voltage across shunt resistor 650 that indicates a reduction of current across RRAM cell 510 just after switching to a high resistive state. A trigger signal to stop the program generator on a programming path may comprise the rising edge of a voltage signal at the output of operational amplifier 660, for example. Of course, such details of a drive circuit are merely examples, and claimed subject matter is not so limited.

Figure 7:
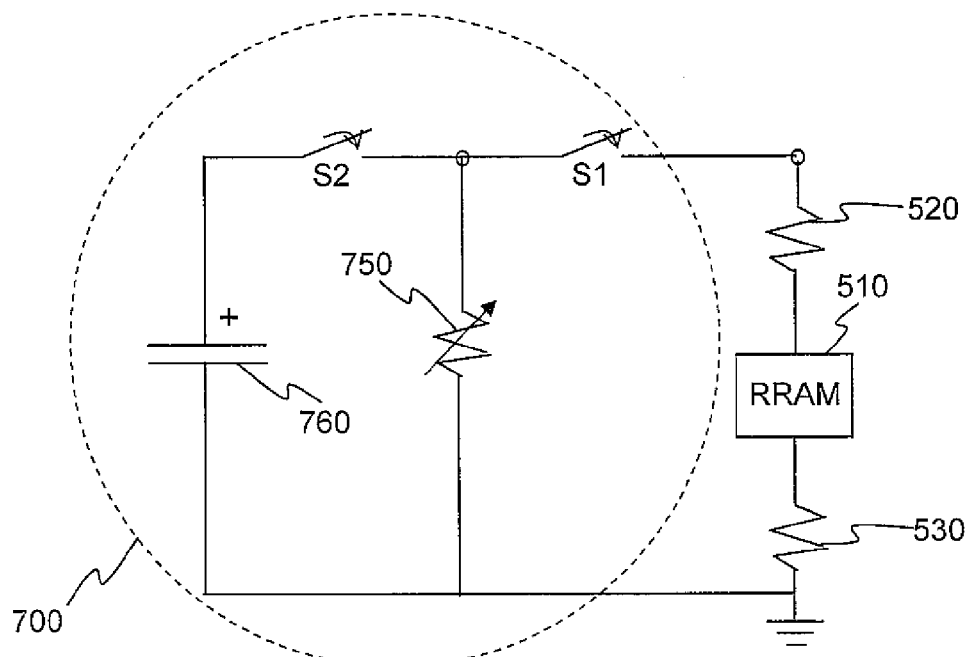
FIG. 7 is a schematic diagram of a circuit to program a memory cell including intrinsic resistance, according to another embodiment.

FIG. 7 is a schematic diagram of a drive circuit 700 to program a memory cell including intrinsic resistance, according to another embodiment. Compared with drive circuit 600, drive circuit 700 may be relatively simple and fast. Drive circuit 700 may also be able to deliver sufficient energy/current in a relatively short time, thus avoiding spurious programming of intermediate unstable states of RRAM cell 510 while transition from a set state to a reset state. For example, drive circuit 700 may generate an electric pulse based, at least in part, on capacitance discharge. Also, drive circuit 700 may generate an electric pulse having a relatively fast response in terms of reducing voltage through a RRAM cell shortly after the set to reset transition. For example, such a fast response may be desirable for RRAM programming speeds of the order of several nanoseconds.

Drive circuit 700 may comprise a capacitor 760 and a parallel variable resistor 750. A first switch S1 may connect drive circuit 700 to RRAM 510 and a second switch S2 may connect capacitor 760 to parallel variable resistor 750. In an implementation, a value of capacitance of capacitor 760 may be selected based, at least in part, on a physical transition model of RRAM 510. For example, a lower bound for a value of capacitance may depend, at least in part, on total energy required during a process of transitioning from a set state to a reset state. Such a lower bound value may be of the order of tens of nano-Farads for 90 nm RRAM cell scales). Parallel variable resistor 750 may be adjusted to determine a compromise between required energy and a voltage RC to provide a relatively fast discharge across capacitor 760 subsequent to a set to reset transition. In other words, a value of resistance may be high enough to ensure a required peak current through RRAM cell 510 while being low enough to ensure a relatively fast capacitance discharge soon after cell transition from low resistive (set) state to high resistive (reset) state. Again, such details of a drive circuit are merely examples, and claimed subject matter is not so limited.

Figure 8:
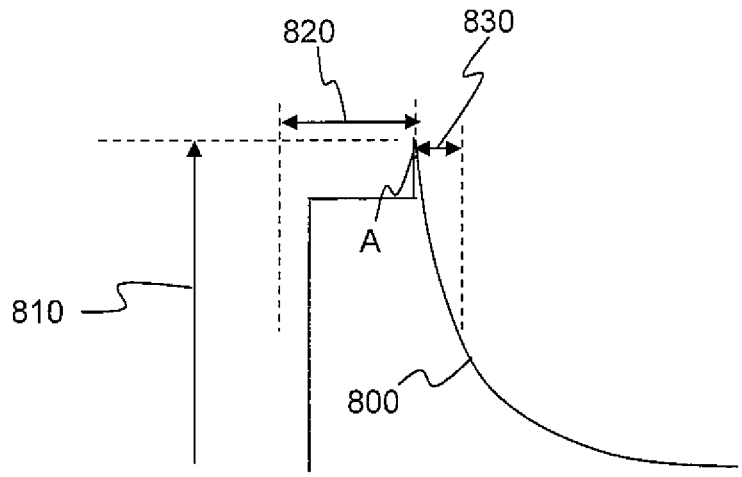
FIG. 8 is a plot of characteristics of an electric pulse to program a memory cell, according to an embodiment.

FIG. 8 is a plot of characteristics of an electric pulse 800 to program a memory cell, according to an embodiment. Such an electric pulse may be generated by circuit 700, for example, to perform a transition from a set state to a reset state of a RRAM cell, as described above. Such a RRAM cell may be incorporated in an array of a memory device, for example. Electric pulse 800 may comprise a first portion 820 to be applied to a RRAM cell to initiate a transition from a set state to a reset state of the RRAM cell. Such a first portion may drive the RRAM cell into a high-voltage unstable state, as discussed above. First portion 820 may include a peak magnitude 810 of electric pulse 800. As an example, first portion 820 may be applied to RRAM cell 510 (FIG. 7) upon closing first and second switches S1 and S2 (e.g., first switch S1 may be closed before second switch S2 to provide electric pulse 800). In an implementation, point A of electric pulse 800 may correspond to RRAM cell 500 being driven to modified set terminus 235 in a high-voltage unstable state, shown in FIG. 2, for example. For example, referring to FIG. 2, first portion 820 of electric pulse 800 may correspond to driving an RRAM cell from set point 240 to modified set terminus 235. At such a point, it may be desirable to relatively rapidly reduce voltage of electric pulse 800 so as to avoid physical damage to the RRAM cell and/or to avoid prolonged time spent in a high-voltage unstable state, which may lead to unpredictable behavior of the RRAM cell (e.g., including failure to reliably write a bit of information to the RRAM cell). Thus, a second portion 830 of electric pulse 800 may be applied during the state transition to decrease a voltage of electric pulse 800 so as to return the RRAM cell to a stable state. In an implementation, second portion 830 may comprise an RC decay portion of electric pulse 800. Particular values for magnitude, duration, and/or slope for various portions of electric pulse 800 may be selected for particular RRAM cells. Such particular values may be determined by any of a number of techniques, including trial and error, for example. Of course, such details of magnitude, duration, and slope of an electric pulse are merely examples, and claimed subject matter is not so limited.

Figure 9:
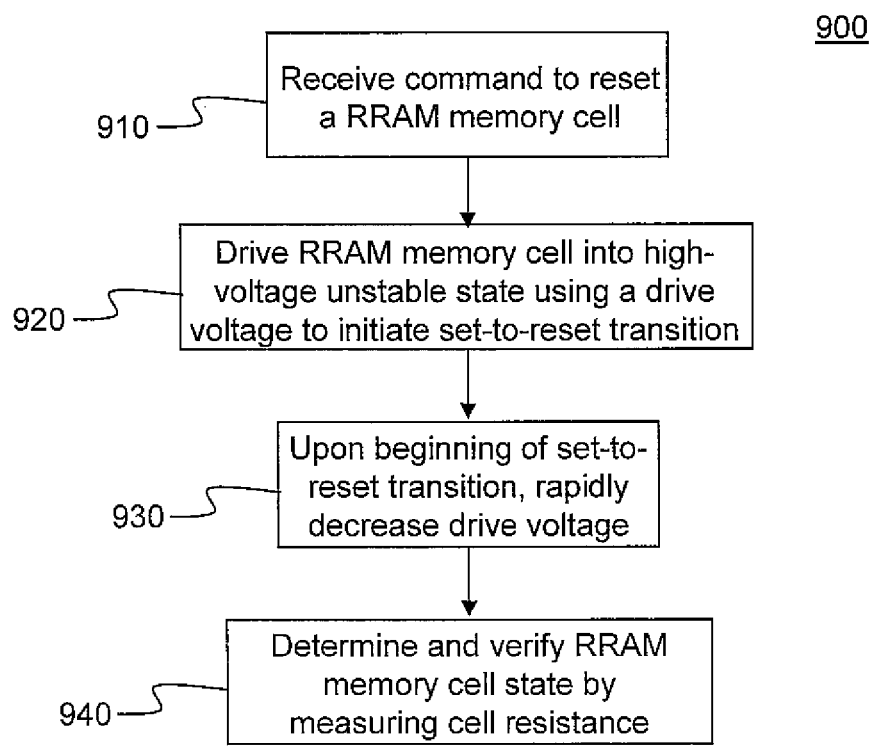
FIG. 9 is a flow diagram of a process to program a memory cell, according to an embodiment.

FIG. 9 is a flow diagram of a process 900 to program a RRAM cell from a set state to a reset state, according to an embodiment. As explained above, such a RRAM cell may be incorporated in a memory array. At block 910, a memory controller may receive a write command from a processor and/or host entity, for example, to reset the RRAM cell. Accordingly, the memory controller may perform a process of transitioning the RRAM cell from a set state to a reset state. At block 920, the memory controller may use circuit 700, for example, to drive the RRAM cell into a high-voltage unstable state to initiate a transition from a set state to a reset state. For example, the RRAM cell may be driven into a high-voltage unstable state by applying a first portion of an electric pulse, such as that shown in FIG. 8. At block 930, a second portion of an electric pulse may be applied to the RRAM cell upon or during the transition from the set state to the reset state. Such a second portion may relatively rapidly decrease the voltage of the electric pulse so as to return the RRAM cell to a stable state. At block 940, in a particular implementation, a program-verify process may be performed by the memory controller to verify that the RRAM cell was properly programmed to a reset state. Thus, the RRAM cell may be read by measuring resistance of the RRAM cells. In another particular implementation, a capacitor may be charged to different voltages after each such verify event. As mentioned above, a reset state of a RRAM cell may comprise a high-resistance state, so that the RRAM cell in a reset state would be expected to have a relatively high resistance. Of course, such details of process 900 are merely examples, and claimed subject matter is not so limited.

Figure 10:
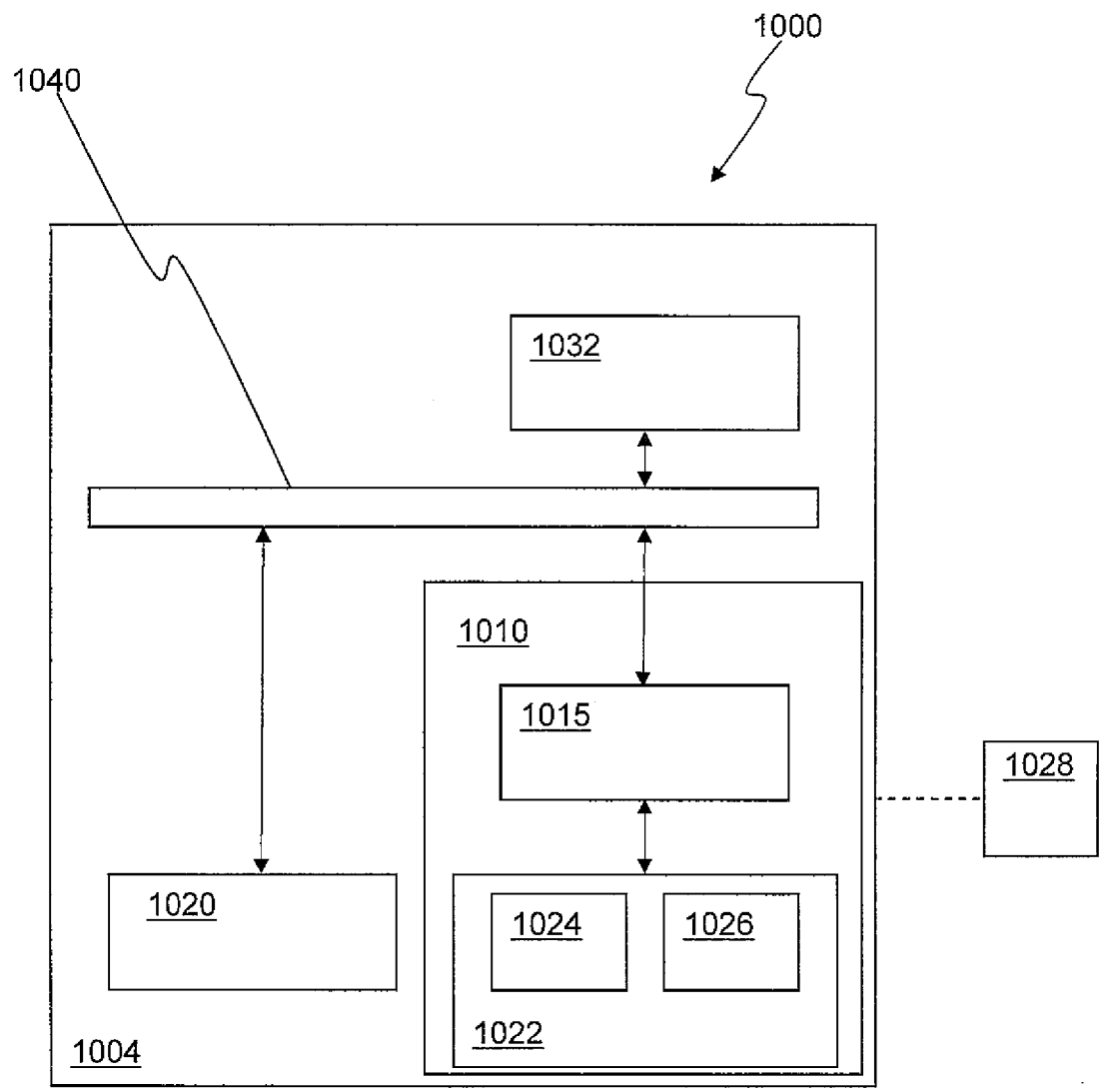
FIG. 10 is a schematic diagram illustrating an exemplary embodiment of a computing system.

FIG. 10 is a schematic diagram illustrating an exemplary embodiment of a computing system 1000 including a memory device 1010, which may comprise RRAM, for example. Such a computing device may comprise one or more processors, for example, to execute an application and/or other code. A computing device 1004 may be representative of any device, appliance, or machine that may be configurable to manage memory device 1010. Memory device 1010 may include a memory controller 1015 and a memory 1022. By way of example but not limitation, computing device 1004 may include: one or more computing devices and/or platforms, such as, e.g., a desktop computer, a laptop computer, a workstation, a server device, or the like; one or more personal computing or communication devices or appliances, such as, e.g., a personal digital assistant, mobile communication device, or the like; a computing system and/or associated service provider capability, such as, e.g., a database or data storage service provider/system; and/or any combination thereof.

It is recognized that all or part of the various devices shown in system 1000, and the processes and methods as further described herein, may be implemented using or otherwise including hardware, firmware, software, or any combination thereof. Thus, by way of example but not limitation, computing device 1004 may include at least one processing unit 1020 that is operatively coupled to memory 1022 through a bus 1040 and a host or memory controller 1015. Processing unit 1020 is representative of one or more circuits configurable to perform at least a portion of a data computing procedure or process. By way of example but not limitation, processing unit 1020 may include one or more processors, controllers, microprocessors, microcontrollers, application specific integrated circuits, digital signal processors, programmable logic devices, field programmable gate arrays, and the like, or any combination thereof. Processing unit 1020 may include an operating system configured to communicate with memory controller 1015. Such an operating system may, for example, generate commands to be sent to memory controller 1015 over bus 1040.

Memory controller 1015 may perform commands such as read and/or write commands initiated by processing unit 1020. In response to a write command, for example, memory controller 1015 may initiate a transition from a set state to a reset state of a memory cell of memory device 1010 by applying a first portion of an electric pulse to drive the memory cell into a high-voltage unstable state. Subsequently, memory controller 1015 may apply a second portion of the electric pulse during the transition to decrease a voltage of the electric pulse so as to return the memory cell to a stable state.

Memory 1022 is representative of any data storage mechanism. Memory 1022 may include, for example, a primary memory 1024 and/or a secondary memory 1026. Memory 1022 may comprise PCM, for example. Primary memory 1024 may include, for example, a random access memory, read only memory, etc. While illustrated in this example as being separate from processing unit 1020, it should be understood that all or part of primary memory 1024 may be provided within or otherwise co-located/coupled with processing unit 1020.

Secondary memory 1026 may include, for example, the same or similar type of memory as primary memory and/or one or more data storage devices or systems, such as, for example, a disk drive, an optical disc drive, a tape drive, a solid state memory drive, etc. In certain implementations, secondary memory 1026 may be operatively receptive of, or otherwise configurable to couple to, a computer-readable medium 1028. Computer-readable medium 1028 may include, for example, any medium that can carry and/or make accessible data, code, and/or instructions for one or more of the devices in system 1000.

Computing device 1004 may include, for example, an input/output 1032. Input/output 1032 is representative of one or more devices or features that may be configurable to accept or otherwise introduce human and/or machine inputs, and/or one or more devices or features that may be configurable to deliver or otherwise provide for human and/or machine outputs. By way of example but not limitation, input/output device 1032 may include an operatively configured display, speaker, keyboard, mouse, trackball, touch screen, data port, etc.

While there has been illustrated and described what are presently considered to be example embodiments, it will be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular embodiments disclosed, but that such claimed subject matter may also include all embodiments falling within the scope of the appended claims, and equivalents thereof.

What is claimed is:

1. A method of programming a non-volatile memory device, the method comprising:
    providing information to said memory device;
    subsequently initiating a transition from a set state to a reset state of a memory cell of said memory device to program said information in said memory cell in response to a write command, by applying a first portion of an electric pulse to drive said memory cell into a high-voltage unstable state; and
    applying a second portion of said electric pulse during said transition to decrease a voltage of said electric pulse so as to return said memory cell to a stable state.

2. The method of claim 1, wherein said non-volatile memory device comprises a resistance random access memory (RRAM).

3. The method of claim 2, wherein said set state of said RRAM comprises a low-resistance state and said reset state of said RRAM comprises a high-resistance state.

4. The method of claim 1, wherein said second portion of said electric pulse comprises a decaying resistor-capacitor (RC) voltage.

5. The method of claim 1, wherein said memory cell comprises one of a plurality of resistance random access memory (RRAM) cells in an array.

6. The method of claim 2, wherein a voltage across said memory cell in said stable state comprises a voltage less than a threshold switching voltage in a reset state of said memory cell.

7. The method of claim 2, wherein a voltage across said memory cell in said high-voltage unstable state comprises a voltage greater than a threshold switching voltage in a reset state of said memory cell.

8. The method of claim 1, wherein maintaining said memory cell in said high-voltage unstable state for longer than a particular time results in physical damage to or spurious programming of said memory cell.

9. A non-volatile memory device comprising:
    a controller to:
        receive information to be stored in said memory device;
        subsequently initiate a transition from a set state to a reset state of a memory cell of said memory device, to program said information in said memory cell in response to a write command, by applying a first portion of an electric pulse to drive said memory cell into a high-voltage unstable state; and
        apply a second portion of said electric pulse during said transition to decrease a voltage of said electric pulse so as to return said memory cell to a stable state.

10. The non-volatile memory device of claim 9, wherein said non-volatile memory device comprises a resistance random access memory (RRAM).

11. The non-volatile memory device of claim 10, wherein said set state of said RRAM comprises a low-resistance state and said reset state of said RRAM comprises a high-resistance state.

12. The non-volatile memory device of claim 9, further comprising a resistor-capacitor (RC) circuit to generate said electric pulse.

13. The non-volatile memory device of claim 9, wherein said memory cell comprises one of a plurality of resistance random access memory (RRAM) cells in an array.

14. The non-volatile memory device of claim 10, wherein a voltage across said memory cell in said high-voltage unstable state comprises a voltage greater than a threshold switching voltage in a reset state of said memory cell.

15. The non-volatile memory device of claim 9, wherein maintaining said memory cell in said high-voltage unstable state for longer than a particular time results in physical damage to said memory cell.

16. A system comprising:
    a memory device comprising an array of memory cells, said memory device further comprising a memory controller to:
        receive information to be stored in said memory device;
        subsequently initiate a transition from a set state to a reset state of a memory cell of said memory array, to program said information in said memory cell in response to a write command, by applying a first portion of an electric pulse to drive said memory cell into a high-voltage unstable state; and
        apply a second portion of said electric pulse during said transition to decrease a voltage of said electric pulse so as to return said memory cell to a stable state; and
    a processor to host one or more applications and to initiate programming said memory cell.

17. The system of claim 16, wherein said non-volatile memory device comprises a resistance random access memory (RRAM).

18. The system of claim 17, wherein said set state of said RRAM comprises a low-resistance state and said reset state of said RRAM comprises a high-resistance state.

19. The system of claim 16, wherein said second portion of said electric pulse comprises a decaying resistor-capacitor (RC) voltage.

20. The system of claim 17, wherein a voltage across said memory cell in said high-voltage unstable state comprises a voltage greater than a threshold switching voltage in a reset state of said memory cell.

* * * * *